(12) United States Patent
Adam et al.

(10) Patent No.: US 8,921,908 B2
(45) Date of Patent: Dec. 30, 2014

(54) ON-CHIP CAPACITORS IN COMBINATION WITH CMOS DEVICES ON EXTREMELY THIN SEMICONDUCTOR ON INSULATOR (ETSOI) SUBSTRATES

(71) Applicant: International Business Machines Corporation, Armonk, NY (US)

(72) Inventors: Thomas N. Adam, Slingerlands, NY (US); Kangguo Cheng, Schenectady, NY (US); Ali Khakifirooz, Mountain View, CA (US); Alexander Reznicek, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/942,227

(22) Filed: Jul. 15, 2013

(65) Prior Publication Data

US 2013/0299889 A1  Nov. 14, 2013

Related U.S. Application Data

(62) Division of application No. 13/314,238, filed on Dec. 8, 2011, now Pat. No. 8,507,354.

(51) Int. Cl.
*H01L 29/94* (2006.01)
*H01L 27/12* (2006.01)
*H01L 27/06* (2006.01)

(52) U.S. Cl.
CPC .......... *H01L 27/1203* (2013.01); *H01L 29/94* (2013.01); *H01L 27/0629* (2013.01)
USPC ........................................................ 257/296

(58) Field of Classification Search
CPC ............ H01L 21/8249; H01L 27/1085; H01L 27/10861; H01L 27/10873; H01L 27/10867
USPC .................. 257/374, 369, 410, 411, E21.637, 257/E21.639, 296, 300, E21.202, E21.204, 257/E21.205, E21.444, E21.647, E21.65, 7, 257/E27.016, E27.085, E29.135, E29.158, 257/E29.159, E29.16
See application file for complete search history.

(56) References Cited

U.S. PATENT DOCUMENTS 5,312,768 A      5/1994  Gonzalez
5,633,181 A  *  5/1997  Hayashi .................. 438/234
(Continued)

OTHER PUBLICATIONS

Simonen Piia, Heinonen A., Kuulusa M., and Nurmi J.i, "Comparison of Bulk and SOI CMOS Technologies in a DSP Processor Circuit Implementation," The 13th International Conference on Microelectronics; Rabat, Morocco, Oct. 29-31, 2001.*

*Primary Examiner* — Yu-Hsi D Sun
*Assistant Examiner* — Christina Sylvia
(74) *Attorney, Agent, or Firm* — Scully, Scott, Murphy & Presser, P.C.; Joseph Petrokaitis

(57) ABSTRACT

A device including a semiconductor on insulator (SOI) substrate including a semiconductor device region and a capacitor device region. A semiconductor device present in the semiconductor device region. The semiconductor device including a gate structure present on a semiconductor on insulator (SOI) layer of the SOI substrate, extension source and drain regions present in the SOI layer on opposing sides of the gate structure, and raised source and drain regions composed of a first portion of an epitaxial semiconductor material on the SOI layer. A capacitor is present in the capacitor device region, said capacitor including a first electrode comprised of a second portion of the epitaxial semiconductor material that has a same composition and crystal structure as the first portion of the epitaxial semiconductor material, a node dielectric layer present on the second portion of the epitaxial semiconductor material, and a second electrode comprised of a conductive material.

14 Claims, 6 Drawing Sheets

(56) References Cited

U.S. PATENT DOCUMENTS

| | | |
|---|---|---|
| 6,417,044 B1 * | 7/2002 | Ono .............................. 438/241 |
| 6,441,421 B1 * | 8/2002 | Clevenger et al. ............ 257/296 |
| 6,864,136 B2 | 3/2005 | Brown et al. |
| 7,102,204 B2 | 9/2006 | Berndlmaier et al. |
| 7,202,123 B1 * | 4/2007 | Pan ................................ 438/197 |
| 7,682,896 B2 | 3/2010 | Ho et al. |
| 7,915,670 B2 | 3/2011 | Anderson et al. |
| 2010/0084715 A1 | 4/2010 | Shen et al. |

* cited by examiner

ON-CHIP CAPACITORS IN COMBINATION WITH CMOS DEVICES ON EXTREMELY THIN SEMICONDUCTOR ON INSULATOR (ETSOI) SUBSTRATES

CROSS REFERENCE TO RELATED APPLICATION

This application is a divisional of U.S. patent application Ser. No. 13/314,238, filed Dec. 8, 2011 the entire content and disclosure of which is incorporated herein by reference.

BACKGROUND

The present disclosure generally relates to capacitors. More particularly, the present disclosure relates to on-chip capacitors.

In order to be able to make integrated circuits (ICs) of higher integration density than currently feasible, one has to find ways to further downscale the dimensions of field effect transistors (FETs), and capacitors that are included within the IC circuit. Scaling achieves compactness and improves operating performance in devices by shrinking the overall dimensions and operating voltages of the device while maintaining the device's electrical properties. In some examples, as the dimensions of the structures within an IC are decreased, the resistivity of some of the components may increase, which can degrade the performance of the devices within the IC.

SUMMARY

In one embodiment, a method of forming a device is provided that includes a semiconductor device on a first region, i.e., semiconductor device region, of a semiconductor on insulator (SOI) substrate, and a capacitor on a second region, i.e., capacitor device region, of a SOI substrate. In one embodiment, the method may include providing a semiconductor on insulator (SOI) substrate that includes a semiconductor device region and a capacitor device region, and forming at least one replacement gate structure on the semiconductor device region and the capacitor device region. An epitaxial semiconductor material may be formed on the SOI substrate on opposing sides of the at least one replacement gate structure in the semiconductor device region and the capacitor device region. An intralevel dielectric layer is formed on the semiconductor device region and the capacitor device region. The at least one replacement gate structure may then be removed, wherein removing of the replacement gate structure from the semiconductor device region exposes a channel portion of the SOI substrate. The intralevel dielectric layer may be removed from the capacitor device region to expose the epitaxial semiconductor material in the capacitor device region. A remaining portion of the intralevel dielectric layer is present over the epitaxial semiconductor material in the semiconductor device region. A material stack of a dielectric layer and a conductive layer is deposited on the channel portion of the SOI substrate in the semiconductor device region and the epitaxial semiconductor material in the capacitor device region.

In another embodiment, a method of forming a device is provided that includes providing a semiconductor on insulator (SOI) substrate including a semiconductor device region and a capacitor device region, and forming a replacement gate structure in at least the semiconductor device region. An epitaxial semiconductor material is formed on the SOI substrate having a first portion in the semiconductor device region and a second portion in the capacitor device region. The first portion of the epitaxial semiconductor material provides raised source and drain regions on opposing sides of the replacement gate structure. The second portion of the epitaxial semiconductor material provides a first electrode of a capacitor. The first portion of the epitaxial semiconductor material and the second portion of the epitaxial semiconductor material have the same composition. The replacement gate structure may be removed to provide an opening to a channel portion of the SOI substrate in the semiconductor device region. A dielectric layer is formed having a first portion in the semiconductor device region and a second portion in the capacitor device region. The first portion of the dielectric layer provides a gate dielectric in the opening to the channel portion of the SOI substrate. The second portion of the dielectric layer provides a node dielectric layer of the capacitor. The first portion of the dielectric layer and the second portion of the dielectric layer have the same composition. A conductive layer is formed having a first portion in the semiconductor device region and a second portion in the capacitor device region. The first portion of the conductive layer provides a gate conductor that is present on the gate dielectric. The second portion of the conductive layer is present on the node dielectric layer and provides a second electrode of the capacitor. The first portion of the conductive layer and the second portion of the conductive layer have the same composition.

In another aspect, a device is provided that includes a semiconductor on insulator (SOI) substrate including a semiconductor device region and a capacitor device region. A semiconductor device is present in the semiconductor device region. The semiconductor device includes a gate structure present on a semiconductor on insulator (SOI) layer of the SOI substrate. The semiconductor device further includes extension source and drain regions present in the SOI layer on opposing sides of the gate structure, and raised source and drain regions composed of a first portion of an epitaxial semiconductor material on the SOI layer. The raised source and drain regions are on opposing sides of the gate structure. A capacitor is present in the capacitor device region. The capacitor may include a first electrode that is composed of a second portion of the epitaxial semiconductor material. The second portion of the epitaxial semiconductor material may have a same composition and crystal structure as the first portion of the epitaxial semiconductor material. The capacitor may further include a node dielectric layer that is present on the second portion of the epitaxial semiconductor material and a second electrode comprised of a conductive material.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
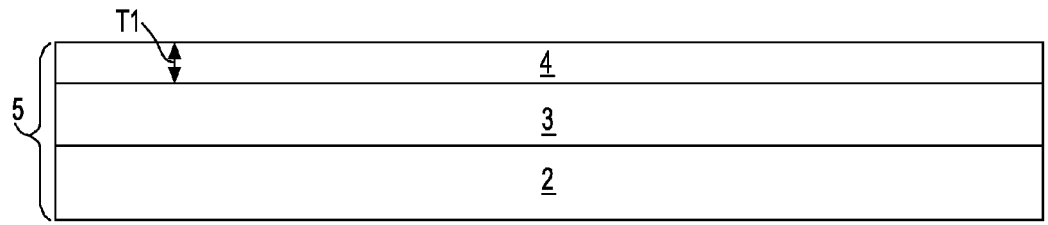
FIG. 1 is a side cross-sectional view depicting one embodiment of an extremely thin semiconductor on insulator (ETSOI) substrate for forming a device including at least one semiconductor device and at least one capacitor, in accordance with one embodiment of the present disclosure.

Detailed embodiments of the present disclosure are disclosed herein; however, it is to be understood that the disclosed embodiments are merely illustrative and may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to devices including extremely thin semiconductor on insulator (ETSOI) substrates, in which semiconductor devices and capacitors may be incorporated on the same ETSOI substrate. An "ETSOI substrate" is a semiconductor on insulator (SOI) substrate, in which the semiconductor on insulator (SOI) layer has a thickness of 10 nm or less. As used herein, a "semiconductor device" is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. Although the semiconductor devices that are depicted in figures of the present disclosure are field effect transistors (FET), it is noted that any semiconductor device is suitable for use with the methods and structures of the present disclosure. A "field effect transistor (FET)" is a semiconductor device in which the output current, i.e., source-drain current, is controlled by the voltage applied to the gate. A FET has three terminals, i.e., gate structure, source region and drain region. The term "functional gate structure" means a structure used to control output current (i.e., flow of carriers in the channel) of a semiconducting device through electrical or magnetic fields. A capacitor is a two terminal electrical device used to store energy. The terminals of the capacitor may be provided by the electrodes. The term "electrode" and "capacitor electrode" as used to describe a component of the capacitor represents one of at least two electrically conductive materials of the capacitor that are separated by a dielectric layer. The "node dielectric layer" is the dielectric layer that is present between the electrodes of the capacitor.

It has been determined that on-chip capacitors formed on ETSOI substrates using the SOI layer of the ETSOI substrate as the lower electrode of the capacitor have a poor quality factor that results from the high resistance of the SOI layer of the ETSOI substrate. In some embodiments, the methods and structures disclosed herein overcome the disadvantages of forming a capacitor with the high resistance SOI layer of an ETSOI substrate by using an epitaxially grown semiconductor material on the upper surface of the SOI layer as the lower electrode of the capacitor. The epitaxially grown semiconductor material has a lower resistance than the SOI layer of the ETSOI substrate, and therefore may provide a low resistance lower electrode. For example, the lower electrode of epitaxial semiconductor material provided by the present methods and structures may have a resistivity ranging from 0.01 $\Omega$cm to 0.0001 $\Omega$cm, whereas a lower electrode formed only from the SOI layer of an ETSOI substrate typically has a resistance ranging from 10 $\Omega$cm to 0.1 $\Omega$cm. Further, the process flow for providing the epitaxially formed semiconductor material of the lower electrode for the capacitor may also provide the raised source and drain region of the semiconductor devices that are being formed on the ETSOI substrate, which allows for easy integration of capacitor devices and semiconductor devices on ETSOI substrates. Additionally, the node dielectric layer of the capacitor may be formed using the same process sequence that forms the gate dielectric of the semiconductor devices that are being formed on the ETSOI substrate, and the upper electrode of the capacitor may be formed using the same process sequence that forms the gate conductor of the semiconductor devices that are being formed on the ETSOI substrate. The details of the methods and structures for forming semiconductor devices and capacitors on an ETSOI substrate in accordance with some embodiments of the present disclosure are now described with reference to FIG. 1-7B.

FIG. 1 depicts one embodiment of an extremely thin semiconductor on insulator (ETSOI) substrate 5. The extremely thin semiconductor on insulator (ETSOI) substrate 5 includes a semiconductor on insulator (SOI) layer 4 over a buried dielectric layer 3 having a thickness T1 of less than 30 nm, wherein the buried dielectric layer 3 is present on a base semiconductor layer 2. The SOI layer 4 may comprise any semiconducting material including, but not limited to silicon (Si), strained Si, SiC, SiGe, SiGeC, Si alloys, Ge, Ge alloys, GaAs, InAs, and InP, or any combination thereof. The SOI layer 4 may be thinned to a desired thickness for the SOI substrate 5 by planarization, grinding, wet etch, dry etch, oxidation followed by oxide etch, or any combination thereof. One method of thinning the SOI layer 4 is to oxidize the silicon (Si) by a thermal dry or wet oxidation process, and then wet etch the oxide layer using a hydrofluoric acid mixture. This process can be repeated to achieve the desired thickness. In one embodiment, the SOI layer 4 of the ETSOI substrate 5 has a thickness ranging from 1.0 nm to 10.0 nm. In another embodiment, the SOI layer 4 has a thickness ranging from 1.0 nm to 5.0 nm. In a further embodiment, the SOI layer 4 has a thickness ranging from 3.0 nm to 8.0 nm. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The buried dielectric layer 3 may be composed of any dielectric material. For example, the buried dielectric layer 3 may be composed of an oxide, e.g., silicon oxide, a nitride, e.g., silicon nitride, silicon oxynitride or a combination thereof. The buried dielectric layer 3 may have a thickness of 300 nm or less. In another embodiment, the buried dielectric layer 3 may have a thickness ranging from 2 nm to 150 nm In yet another embodiment, the buried dielectric layer 3 may have a thickness ranging from 5 nm to 30 nm.

The buried dielectric layer 3 that is present underlying the SOI layer 4 and atop the base semiconductor layer 2 may be formed by implanting a high-energy dopant into the ETSOI substrate 5 and then annealing the structure to form a buried insulating layer, i.e., dielectric layer 3. In another embodiment, the dielectric layer 3 may be deposited or grown prior to the formation of the SOI layer 4. In yet another embodiment, the ETSOI substrate 5 may be formed using wafer-bonding techniques, where a bonded wafer pair is formed utilizing glue, adhesive polymer, or direct bonding.

Figure 2A:
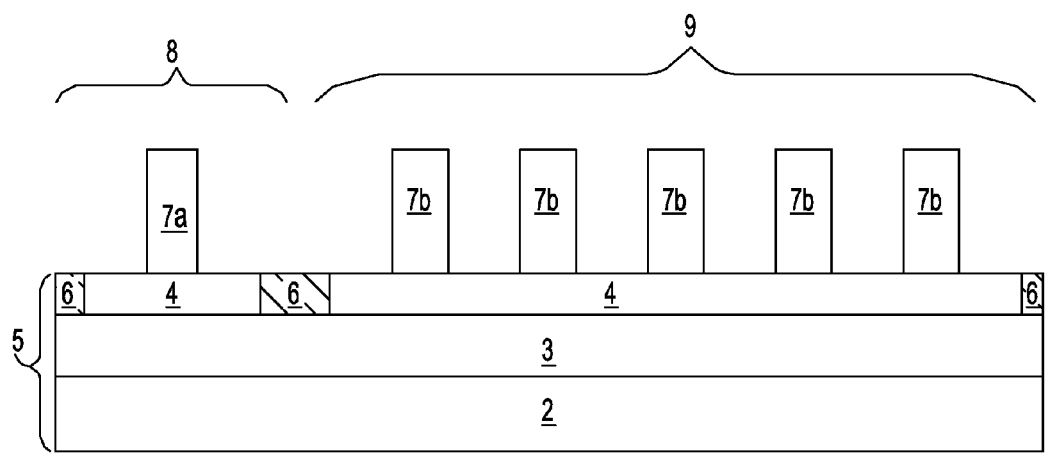
FIG. 2A is a side cross-sectional view depicting one embodiment of forming at least one replacement gate structure on a semiconductor device region and a capacitor device region of the ETSOI substrate that is depicted in FIG. 1, in accordance with one embodiment of the present disclosure.
Figure 2B:
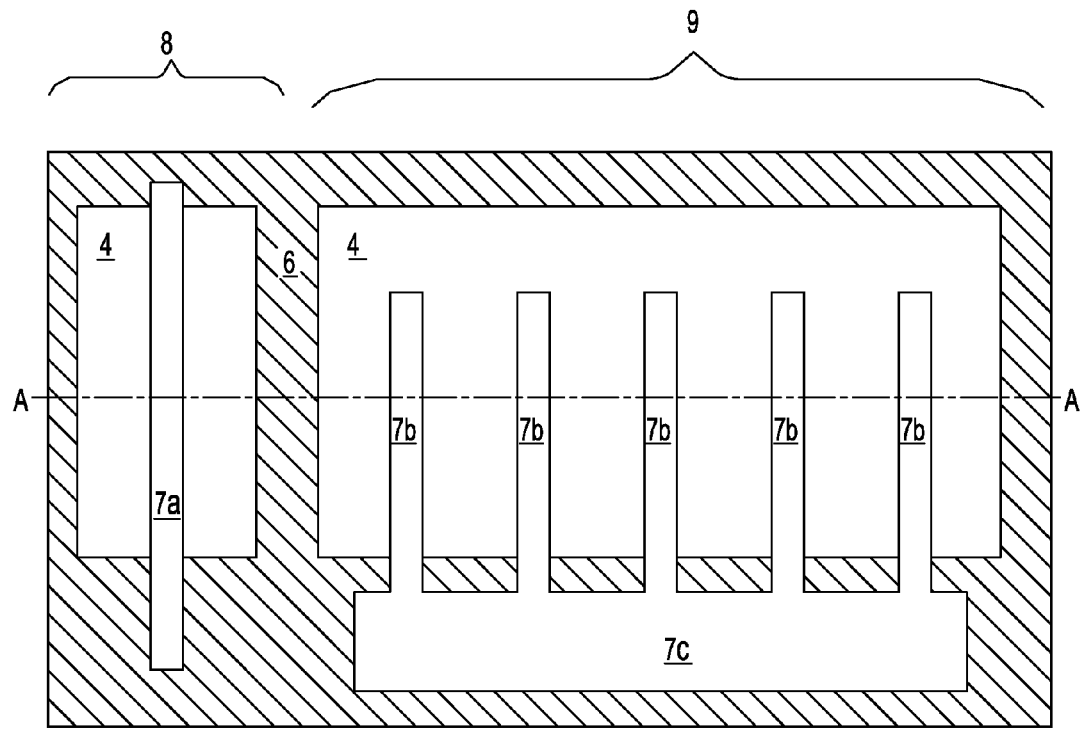
FIG. 2B is a top down planar view of the structure depicted in FIG. 2A, in which section line A-A in FIG. 2B corresponds to the cross section depicted in FIG. 2A.

FIGS. 2A and 2B depict one embodiment of forming at least one replacement gate structure 7 on a semiconductor device region 8 and a capacitor device region 9 of the ETSOI substrate 5 that is depicted in FIG. 1. The semiconductor device region 8 of the ETSOI substrate 5 is the region of the ETSOI substrate 5 in which semiconductor devices are subsequently formed, and the capacitor device region 9 is the region of the ETSOI substrate 5 in which the capacitors are subsequently formed. An isolation region 6 separates the semiconductor device region 8 from the capacitor device region 9 of the ETSOI substrate 5. The isolation region 6 typically surrounds the semiconductor device region 8 and the capacitor device region 9, and therefore defines the length and width dimensions of the semiconductor device region 8 and the capacitor device region 9.

The isolation region 6 may be formed using etching and deposition processes. For example, and in one embodiment, an etch mask, such as a patterned photoresist, may be formed on the SOI layer 4, in which the opening through the etch mask exposes the portion of the SOI layer 4 in which the isolation region 6 is to be formed. An etch process may then remove the exposed portions of the SOI layer 4 with an etch chemistry that is selective to the buried dielectric layer 3 and the etch mask. In one embodiment, the etch process that removes the exposed portions of the SOI layer 4 is an anisotropic etch process. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. The opening, e.g., trench that is formed by etching the SOI layer 4 is then filled with a dielectric material to provide the isolation region 6, e.g., trench isolation region. In one embodiment, chemical vapor deposition (CVD) or another like deposition process is used to fill the opening, e.g., trench, with a dielectric material, such as an oxide, nitride or oxynitride material.

FIG. 2A depicts one embodiment of forming at least one replacement gate structure 7a, 7b in the semiconductor device region 8 and the capacitor device region 9. Each of the at least one replacement gate structures 7a in the semiconductor device region 8 may include sacrificial material that defines the geometry of a later formed functional gate structure that functions to switch the semiconductor device from an "on" to "off" state, and vice versa. The replacement gate structures 7b that are present in the capacitor device region 9 provide a template for the subsequently formed second epitaxial semiconductor material that provides the lower electrode of the capacitor that is formed in the capacitor device region 9. In one embodiment, as illustrated in FIG. 2A, each of the replacement gate structures 7a, 7b may be composed of a single layer of sacrificial material. In another embodiment, each of the replacement gate structures 7a, 7b includes a sacrificial material stack (not depicted) on the ETSOI substrate 5, in which the sacrificial material stack may be composed of a plurality of layers of sacrificial material.

In one embodiment, at least one of the replacement gate structures 7a, 7b may be composed of a semiconductor-containing material, such as a silicon-containing material. Silicon-containing materials that are suitable for the replacement gate structures 7a, 7b include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the replacement gate structure 7a, 7b is amorphous silicon. In some embodiments, other materials, such as dielectrics and metals, can be employed as the sacrificial material of the replacement gate structure 7a, 7b so long as the material selected can be removed selective to the ETSOI substrate 5 and the subsequently formed intralevel dielectric.

The sacrificial material layer that provides the at least one replacement gate structure 7a, 7b may be formed using a deposition process, such as chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof. The sacrificial material may also be deposited using evaporation, chemical solution deposition, spin on deposition, and physical vapor deposition (PVD) methods.

The sacrificial material may be patterned and etched to provide the replacement gate structures 7a, 7b that are present in the semiconductor device region 8 and the capacitor device region 9. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. In some examples, the selectivity may be greater than 10:1. In other embodiments, the selectivity may be greater than 100:1.

In one embodiment, the etch process removes the exposed portions of the sacrificial material layer with an etch chemistry that is selective to the ETSOI substrate 5 and the isolation region 6. In one another embodiment, the etch process that forms the replacement gate structure 7a, 7b is an anisotropic etch. Examples of anisotropic etching that can be used at this point of the present disclosure include reactive ion etching, ion beam etching, plasma etching or laser ablation. The width W1 of each of the replacement gate structures 7a, 7b may range from 10 nm to 250 nm. In another embodiment, the width W1 of each of the replacement gate structures 7a, 7b may range from about 15 nm to 150 nm. In yet another embodiment, the width W1 of each of the replacement gate structures 7a, 7b may range from 20 nm to 100 nm.

The number and dimensions of the replacement gate structures 7a, 7b in the capacitor device region 9 may dictate the dimensions and number of subsequently formed islands of epitaxial semiconductor material that provide the first electrode, i.e., lower electrode, of the capacitor. Additionally, the spacing between adjacent replacement gate structures 7b in the capacitor device region 9 dictates the pitch of the subsequently formed islands of epitaxial semiconductor material. The term "pitch" means the center-to-center distance between two repeating elements of a circuit including semiconductor devices. In one embodiment, the pitch P1 of the replacement gate structures 7b in the capacitor device region 9 may be measured from the center of the upper surface of a first replacement gate structure to the center of the upper surface of an adjacent replacement gate structure. In one example, the gate pitch P1 ranges from 20 nm to 2000 nm. Although FIG. 2A only depicts a single replacement gate structure 7a in the semiconductor device region 8, the present disclosure is not limited to only this example, as any number of replacement gate structure 7a may be present in the semiconductor device region 8. Referring to FIG. 2B, the plurality of the replacement gate structures 7b that are present in the capacitor device region 9 may be interconnected by a connecting replacement structure 7c that is present over the isolation region 6.

Figure 3A:
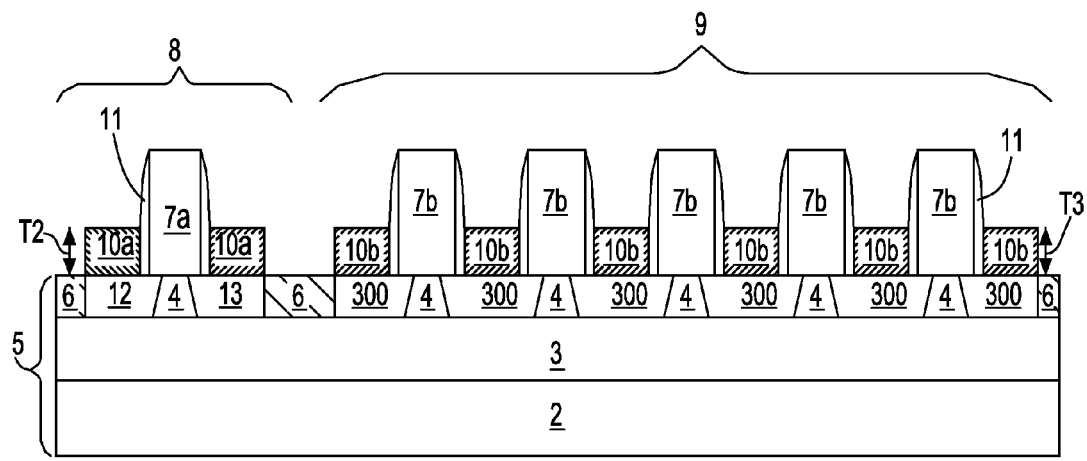
FIG. 3A is a side cross-sectional view depicting one embodiment of forming an epitaxial semiconductor material on the SOI layer of the ETSOI substrate on opposing sides of the at least one replacement gate structure in the semiconductor device region and the capacitor device region, in accordance with one embodiment of the present disclosure.
Figure 3B:
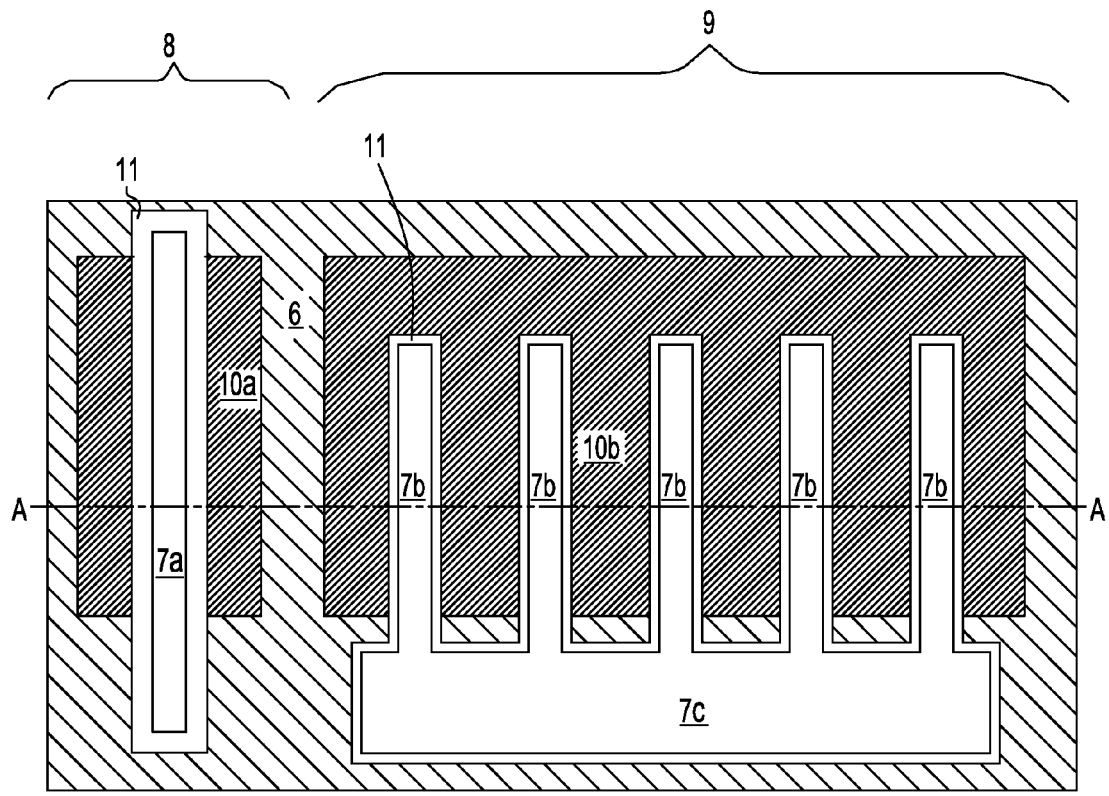
FIG. 3B is a top down planar view of the structure depicted in FIG. 3A, in which section line A-A in FIG. 3B corresponds to the cross section depicted in FIG. 3A.

Referring to FIGS. 3A and 3B, at least one dielectric spacer 11 may be formed on the sidewall of the replacement gate structures 7a, 7b, as well as the connecting replacement structure 7c, and extension source and drain regions 12, 13 may be formed in the SOI layer 4 of the ETSOI substrate 5 in the semiconductor device region 8. The material of the at least one dielectric spacer 11 may be any dielectric material. For example, the at least one dielectric spacer 11 may be an oxide, nitride or oxynitride material. In one example, the at least one dielectric spacer 11 is composed of silicon oxide. In another example, the at least one dielectric spacer 11 is composed of silicon nitride. In one embodiment, the material layer for the at least one dielectric spacer 11 may be formed using thermal growth or deposition in combination with etching. In one embodiment, the at least one dielectric spacer 11 has a greatest width, e.g., width at the base of the dielectric spacer 11, that ranges from 1.0 nm to 50.0 nm. In another embodiment, the at least one dielectric spacer 11 has a greatest width that ranges from 10.0 nm to 20.0 nm. The at least one spacer 11 may be formed before or after the extension source and drain regions 12, 13 are formed. In some embodiments, the at least one dielectric spacer 11 is optional, and may be omitted.

Extension source and drain regions 12, 13 may be formed in the SOI layer 4 of the ETSOI substrate 5 by ion implantation. In the embodiments, in which the semiconductor devices that are being formed in the semiconductor device region 8 are p-type semiconductor devices, the extension source and drain regions 12, 13 are doped to a p-type conductivity, and in the embodiments in which the semiconductor devices that are being formed in the semiconductor device region 8 are n-type semiconductor devices, the extension source and drain regions 12, 13 are doped to an n-type conductivity. As used herein, "p-type" refers to the addition of impurities to an intrinsic semiconductor that creates deficiencies of valence electrons. The p-type conductivity semiconductor devices are typically produced within Si-containing materials by doping the extension source and drain regions 12, 13 with elements from group III-A of the Periodic Table of Elements. In a silicon-containing SOI layer 4, examples of p-type dopants, i.e., impurities include but are not limited to boron, aluminum, gallium and indium. As used herein, "n-type" refers to the addition of impurities that contributes free electrons to an intrinsic semiconductor. N-type conductivity semiconductor devices are typically produced within Si-containing material by doping the extension source and drain regions 12, 13 with elements from group V-A of the Periodic Table of Elements. In a silicon containing SOI layer 4, examples of n-type dopants, i.e., impurities, include but are not limited to, antimony, arsenic and phosphorous. In one embodiment, the concentration of dopant in the extension source and drain regions 12, 13 may range from $1\times10^{18}$ atoms/cm$^3$ to $2\times10^{21}$ atoms/cm$^3$.

In some embodiments, the SOI layer 4 that is present in the capacitor device region 9 is doped with the same dopant used to form the extension source and drain regions 12, 13 in the semiconductor device region 8, in which doping of the SOI layer 4 in the capacitor device region 9 may occur simultaneously with formation of the extension source and drain regions 12, 13. In this embodiment, doped SOI layer portions 300 are present in the capacitor device region 9 that become a part of the lower electrode for the capacitor. This is particularly true for the embodiments in which the extension source and drain regions 12, 13 are formed from in-situ doped epitaxy raised source and drain, in which annealing is used to drive dopants from epitaxial raised source and drain regions towards channel. In another embodiment, the capacitor device region 9 can be masked when ion implantation is used to form the extension source and drain regions 12, 13 in the semiconductor device region 8. In this embodiment, the doped SOI layer portions 300 may not be present.

FIGS. 3A and 3B depict one embodiment of forming a first portion of an epitaxial semiconductor material 10a (hereafter referred to as "first epitaxial semiconductor material 10a") on an exposed portion of the SOI layer 4 of the ETSOI substrate 5 on opposing sides of the replacement gate structure 7a in the semiconductor device region 8, and forming a second portion of the epitaxial semiconductor material 10b (hereafter referred to as "second epitaxial semiconductor material 10b") on the exposed portion of the SOI layer 4 of the ETSOI substrate 5 that is between the adjacent replacement gate structures 7b in the capacitor device region 9. The first and second epitaxial semiconductor materials 10a, 10b may be composed of any semiconductor material that may be formed on the SOI layer 4, and is typically doped to an n-type or p-type conductivity. For example, the first and second epitaxial semiconductor materials 10a, 10b may be a silicon-containing material, such as silicon (Si), single crystal silicon, multi-crystalline silicon, polycrystalline silicon, silicon germanium (SiGe), single crystal silicon germanium, multi-crystalline silicon germanium, polycrystalline silicon germanium and silicon doped with carbon. In other examples, the first and second epitaxial semiconductor materials 10a, 10b, may be composed of other semiconductor materials, such as germanium and compound semiconductors, e.g., III-V semiconductor materials. In one embodiment, the concentration of the dopant that dictates the conductivity type of the first and second epitaxial semiconductor materials 10a, 10b may range from $1\times10^{18}$ dopants/cm$^3$ to $2\times10^{21}$ dopants/cm$^3$. The first epitaxial semiconductor material 10a and the second epitaxial semiconductor material 10b are typically formed simultaneously.

"Epitaxial growth and/or deposition" means the growth of a semiconductor material on a deposition surface of a semiconductor material, in which the semiconductor material being grown has the same crystalline characteristics as the semiconductor material of the deposition surface. The term "epitaxial" denotes a material that has been formed by epitaxial growth, in which the deposited material has the same crystalline characteristics as the semiconductor material on which the material is present. In some embodiments, when the chemical reactants are controlled and the system parameters set correctly, the depositing atoms arrive at the surface of the SOI layer 4 with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. The temperature for epitaxial deposition typically ranges from 550° C. to 900° C. Although higher temperature typically results in faster deposition, the faster deposition may result in crystal defects and film cracking.

Referring to FIGS. 3A and 3B, and in some embodiments the first epitaxial semiconductor material 10a that is formed on the exposed surface of the SOI layer 4 in the semiconductor device region 8 provides raised source and drain regions. As used herein, the term "raised" in combination with source and/or drain denotes that the source and/or drain region is formed on the SOI layer 4 that provides the upper surface of the ETSOI substrate 5. The raise source and drain regions typically have the same conductivity type, i.e., n-type or p-type, as the extension source and drain regions 12, 13. The raised source and drain regions may be composed of an epitaxially formed material that is doped using in-situ doping processes, or is doped by ion implantation, or is doped by gas phase doping. In one example, the raised source and drain regions may be provided by a first epitaxial semiconductor material 10a that is composed of silicon having an n-type conductivity, in which the concentration of dopant in the first epitaxial semiconductor material 10a may range from $1\times10^{18}$ atoms/cm$^3$ to $2\times10^{21}$ atoms/cm$^3$. The raised source region in combination with the extension source region 12 provides the source region of the semiconductor device, e.g., FET. As used herein, the term "source" is a doped region in the semiconductor device, in which majority carriers are flowing into the channel region of the semiconductor device. The raised drain region in combination with the extension drain region 13 provides the drain region of the semiconductor device, e.g., FET. The term "drain" means a doped region in semiconductor device located at the end of the channel, in which carriers are flowing out of the semiconductor device through the drain. As used herein, the term "channel portion" is the region in the SOI layer 4 that is underlying the subsequently formed function gate structure, wherein the channel portion is between the extension source region 12 and extension drain region 13 of the semiconductor device that becomes conductive when the semiconductor device is turned on. Typically, the first epitaxial semiconductor material 10a that provides the raised source and drain regions has a thickness T2 that range from 5 nm to 50 nm. In another embodiment, the first epitaxial semiconductor material 10a that provides the raised source and drain regions has a thickness T2 that range from 15 nm to 25 nm.

Referring to FIGS. 3A and 3B, the second epitaxial semiconductor material 10b that is formed on the exposed portions of the SOI layer 4 in the capacitor device region 9 provides at least a portion of the lower electrode for the capacitor that is formed in the capacitor device region 9. The second epitaxial semiconductor material 10b may be present on the entire exposed surface of the SOI layer 4 in the capacitor device region 9 that is not covered by the replacement gate structures 7b that are present in the capacitor device region 9. The second epitaxial semiconductor material 10b is composed of a conductive material and has dimensions that provide a low resistance lower electrode, when compared to electrodes that are formed only from the SOI layer 4. In one example, the second epitaxial silicon material 10b has an electrical conductivity at room temperature, e.g., 20° C. to 25° C., that is greater than $10^{-10}(\Omega\text{-m})^{-1}$.

In another example, the second epitaxial silicon material 10b has an electrical conductivity at room temperature, e.g., 20° C. to 25° C., that ranges from 100 $(\Omega\text{-cm})^{-1}$ to 10000 $(\Omega\text{-cm})^{-1}$. To provide an electrical conductivity that is suitable for a lower electrode of a capacitor, the second epitaxial semiconductor material 10b is typically doped with n-type, p-type or a combination of n-type and p-type dopants in a concentration ranging from $1\times10^{18}$ atoms/cm$^3$ to $2\times10^{21}$ atoms/cm$^3$. In one embodiment, the second epitaxial semiconductor material 10b that provides the lower electrode of the capacitor has a thickness T3 that range from 5 nm to 50 nm. In another embodiment, the second epitaxial semiconductor material 10b that provides the lower electrode of the capacitor has a thickness T3 that range from 15 nm to 25 nm. The second epitaxial semiconductor material 10b is typically composed of the same material with the same dopant conductivity and concentration as the first epitaxial semiconductor material 10b.

In some embodiments, in which the first epitaxial semiconductor material 10a and the second epitaxial semiconductor material 10b are composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane ($(CH_3)SiH_3$), dimethylsilane ($(CH_3)SiH_2$), ethylsilane ($(CH_3CH_2)SiH_3$), methyldisilane ($(CH_3)Si_2H_5$), dimethyldisilane ($(CH_3)_2Si_2H_4$), hexamethyldisilane ($(CH_3)_6Si_2$) and combinations thereof. In some embodiments, in which the first epitaxial semiconductor material 10a and the second epitaxial semiconductor material 10b are composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the first epitaxial semiconductor material 10a and the second epitaxial semiconductor material 10b are composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

Figure 4:
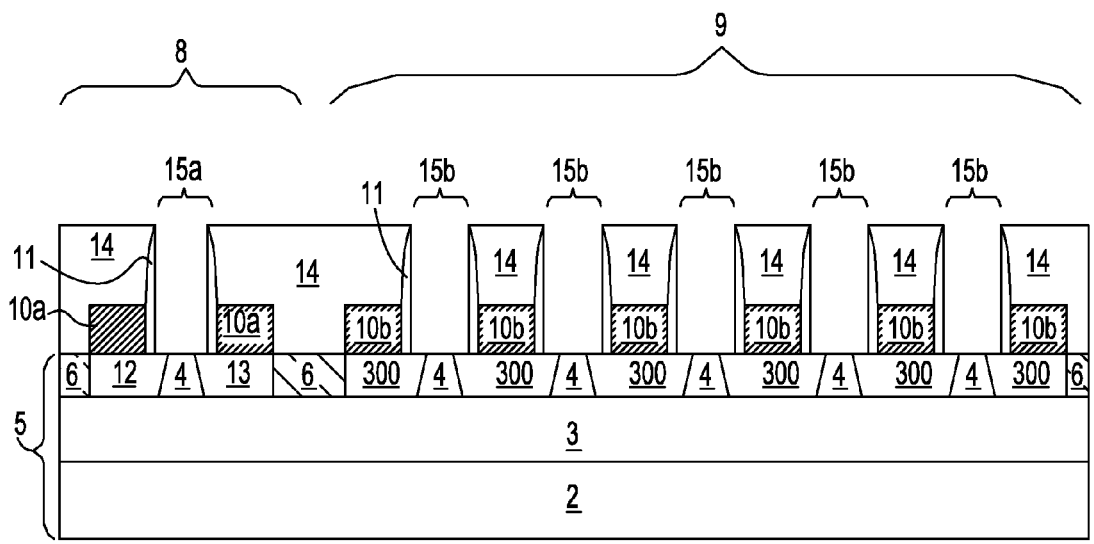
FIG. 4 is a side cross-sectional view that depicts forming an intralevel dielectric layer on the semiconductor device region and the capacitor device region, and removing the at least one replacement gate structure, in accordance with one embodiment of the present disclosure.

FIG. 4 depicts one embodiment of depositing an intralevel dielectric layer 14 on the semiconductor device region 8 and the capacitor device region 9, planarizing the intralevel dielectric layer 14 until an upper surface of the replacement gate structures 7a, 7b is exposed, and removing the replacement gate structures 7a, 7b from the semiconductor device region 8 and the capacitor device region 9. In one embodiment, the intralevel dielectric layer 14 may be blanket deposited atop the entire ETSOI substrate 5 and planarized. The blanket dielectric may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, $\alpha$-C:H). Additional choices for the blanket dielectric includes any of the aforementioned materials in porous form, or in a form that changes during processing to or from being porous and/or permeable to being non-porous and/or non-permeable. The intralevel dielectric layer 14 may be formed using a deposited process, such as chemical vapor deposition (CVD). Variations of CVD processes that are suitable for forming the intralevel dielectric layer 14 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The intralevel dielectric layer 14 may also be deposited using evaporation, chemical solution deposition, spin on deposition, and physical vapor deposition (PVD) methods.

Following deposition, the intralevel dielectric layer 14 may be planarized so that the upper surface of the intralevel dielectric layer 14 is coplanar with the upper surface of the replacement gate structures 7a, 7b, as depicted in FIG. 4. Planarization is a material removal process that employs at least mechanical forces, such as frictional media, to produce a planar surface. The intralevel dielectric layer 4 may be planarized using chemical mechanical planarization (CMP). Chemical mechanical planarization (CMP) is a material removal process using both chemical reactions and mechanical forces to remove material and planarize a surface.

FIG. 4 further depicts one embodiment of removing the replacement gate structures 7a, 7b that are depicted in FIGS. 3A and 3B to provide an opening 15a, 15b to an exposed portion of the SOI layer 4 in the semiconductor device region 8 and the capacitor device region 9. The replacement gate structures 7a, 7b, as well as the connecting replacement structure 7c, are typically removed using a selective etch process that removes the replacement gate structures 7a, 7b, 7c selectively to the SOI layer 4 of the ETSOI substrate 5, the at least one dielectric spacers 11 and the intralevel dielectric layer 14. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch. In one embodiment, in which the replacement gate structures 7a, 7b, 7c are composed of polysilicon, the SOI layer 4 is a silicon-containing material, the at least one dielectric spacer 11 is composed of silicon nitride, and the intralevel dielectric layer 14 is composed of silicon oxide, the wet etch chemistry for removing the replacement gate structures 7a, 7b, 7c may be composed of DHF and hot ammonia, or TetraMethyl Ammonium Hydroxide (TMAH).

Figure 5:
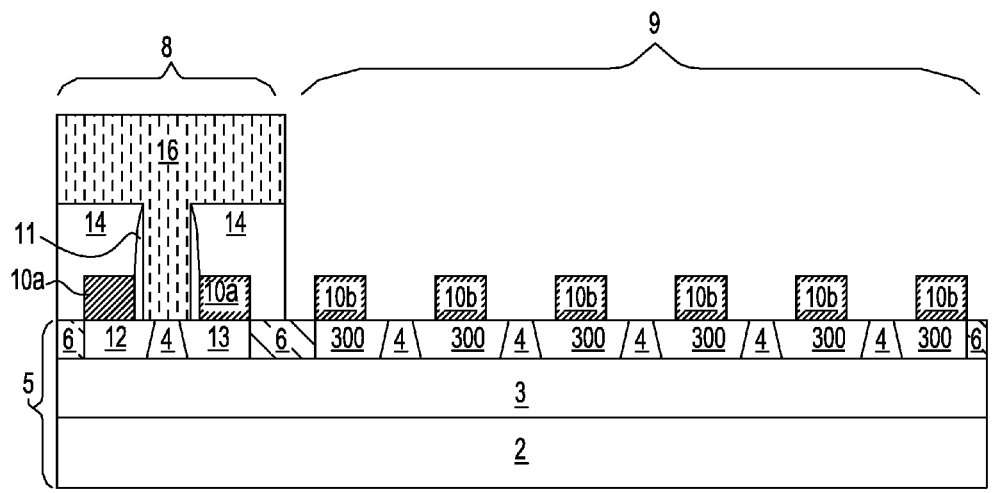
FIG. 5 is a side cross-sectional view that depicts applying an etch mask protecting the semiconductor device region, and removing the intralevel dielectric layer from the capacitor device region to expose the epitaxial semiconductor material in the capacitor device region, in accordance with one embodiment of the present disclosure.

FIG. 5 depicts applying an etch mask 16 protecting the semiconductor device region 8, and removing the intralevel dielectric layer 14 from the capacitor device region 9 to expose the second epitaxial semiconductor material 10b that is present in the capacitor device region 9. The etch mask 16 may be composed of a photoresist material, and may be formed using deposition and photolithography processes. More specifically, a layer of photoresist is deposited atop the entire ETSOI substrate 5 including the semiconductor device region 8 and the capacitor device region 9. The photoresist layer is then selectively exposed to light and developed to pattern an etch mask 16 protecting the semiconductor device region 8 of the ETSOI substrate 5 and exposing the capacitor device region 9 of the ETSOI substrate 5.

The exposed portion of the intralevel dielectric layer 14 and the at least one dielectric spacer 11 that are present in the capacitor device region 9 are then removed, while the portion of the intralevel dielectric layer 14 that is present in the semiconductor device region 8 is protected by the etch mask 16. For example, the exposed portion of the intralevel dielectric layer 14 and the at least one dielectric spacer 11 that is present in the capacitor device region 9 may be removed by an etch that removes the material of the intralevel dielectric layer 14 and the at least one dielectric spacer 11 selectively to the etch mask 16, the SOI layer 4 and the second epitaxial semiconductor material 10b. The etch may be an anisotropic etch, such as reactive ion etch, or an isotropic etch, such as a wet chemical etch. Following removal of the intralevel dielectric 14 from the capacitor device region 9, the etch mask 16 may be removed. In some embodiments, the etch mask 16 may be removed by selective etching, chemical stripping or oxygen ashing.

Figure 6A:
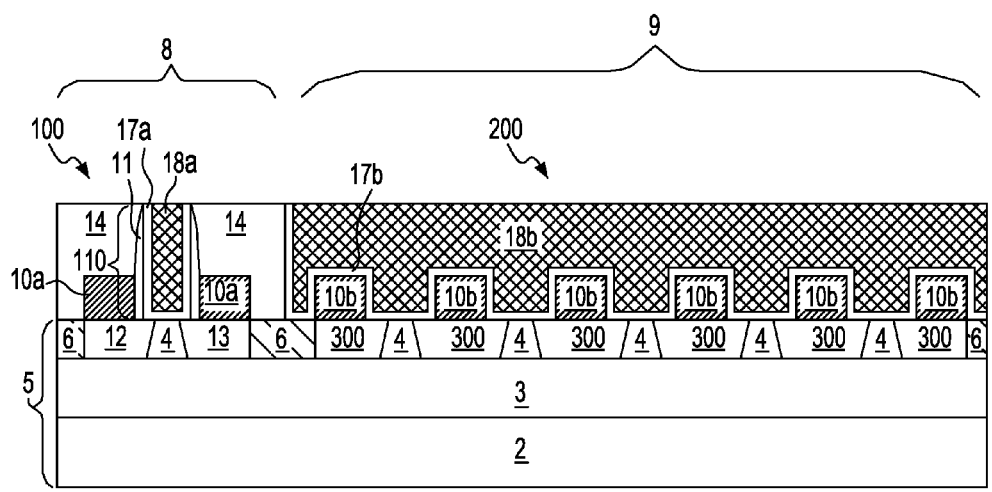
FIG. 6A is a side cross-sectional view that depicts forming a material stack of a dielectric layer and a conductive layer on the channel portion of the SOI substrate in the semiconductor device region and the epitaxial semiconductor material in the capacitor device region, in accordance with one embodiment of the present disclosure.
Figure 6B:
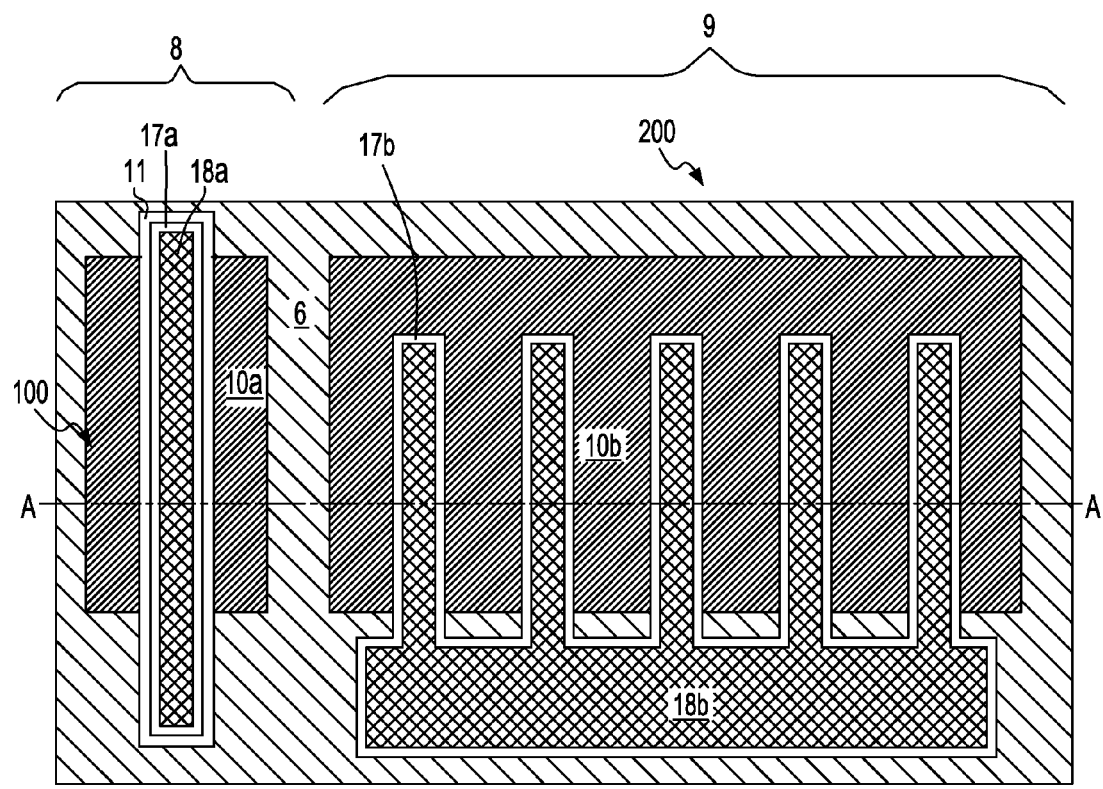
FIG. 6B is a top down planar view of the structure depicted in FIG. 6A, in which section line A-A in FIG. 6B corresponds to the cross section depicted in FIG. 6A.

FIGS. 6A and 6B depict forming a material stack of a dielectric layer 17a, 17b and a conductive layer 18a, 18b on the channel portion of the SOI substrate 4 in the semiconductor device region 8 and the second epitaxial semiconductor material 10b in the capacitor device region 9. In one embodiment, the first portion of the dielectric layer 17a (hereafter referred to as "first dielectric layer 17a") provides the gate dielectric layer of the functional gate structure 110 to the semiconductor device 100, and the second portion of the dielectric layer 17b (hereafter referred to as "second dielectric layer 17b") provides the node dielectric layer of the capacitor 200. Therefore, the first dielectric layer 17a may also be referred to as the "gate dielectric portion" and the second dielectric layer 17b may also be referred to as the "node dielectric portion". The first and second dielectric layers 17a, 17b may be composed of any dielectric material including oxide, nitride and oxynitride containing dielectrics. For example, when the first and second dielectric layers 17a, 17b are composed of an oxide, the first and second dielectric layers 17a, 17b may be composed of silicon oxide. In another example, the first and second dielectric layers 17a, 17b may be composed of a high-k dielectric material. The term "high-k" denotes a material having a dielectric constant that is greater than the dielectric constant of silicon oxide ($SiO_2$). For example, a high-k dielectric material typically has a dielectric constant that is greater than 4.0. In another example, a high-k dielectric material that may be employed for the first and second dielectric layers 17a, 17b has a dielectric constant that is greater than the 10. In yet another embodiment, the high-k gate dielectric layer is comprised of a material having a dielectric constant ranging from 10 to 30. The dielectric constants mentioned herein are relative to a vacuum at room temperature, i.e., 20° C. to 25° C. Some examples of high-k dielectric materials suitable for the first and second dielectric layers 17a, 17b include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the first and second dielectric layers 17a, 17b is hafnium oxide ($HfO_2$).

The first and second dielectric layers 17a, 17b are typically formed simultaneously by blanket depositing a material layer for the first and second dielectric layers 17a, 17b over the semiconductor device region 8 and the capacitor device region 9. Therefore, the first and second dielectric layers 17a, 17b typically have the same composition. In one embodiment, the first and second dielectric layers 17a, 17b are formed using a conformal deposition process. The term "conformal" denotes a layer having a thickness that does not deviate from greater than or less than 30% of an average value for the thickness of the layer. In one embodiment, the first and second dielectric layers 17a, 17b is formed using a deposition process, such as chemical vapor deposition (CVD). Variations of chemical vapor deposition (CVD) processes for depositing the first and second dielectric layers 17a, 17b include, but are not limited to, Atmospheric Pressure CVD (APCVD), Low Pressure CVD (LPCVD) and Plasma Enhanced CVD (PECVD), Metal-Organic CVD (MOCVD) and others. One example of a conformal deposition process is plasma enhanced chemical vapor deposition (PECVD). In another embodiment, the first and second dielectric layers 17a, 17b may be formed by a thermal growth process such as, for example, oxidation, nitridation or oxynitridation. In one embodiment, each of the first and second dielectric layers 17a, 17b has a thickness that ranges from 1 nm to 10 nm. In another embodiment, each of the first and second dielectric layers 17a, 17b has a thickness that ranges from 2 nm to 5 nm.

In one embodiment, the first dielectric layer 17a that provides the gate dielectric of the functional gate structure 110 to the semiconductor device 100 is present on the sidewalls of the opening to the channel portion of the SOI layer 4 that is provided by the sidewalls of the at least one dielectric spacer 11. The first dielectric layer 17a is also present on the base of the opening that is provided by the exposed upper surface of the SOI layer 4. In one embodiment, the second dielectric layer 17b that provides the node dielectric of the capacitor 200 is present on an upper surface and sidewall surfaces of the second epitaxial semiconductor material 10b and is present on the exposed upper surface of the SOI layer 4 that is between the adjacent portions of the second epitaxial semiconductor material 10b in the capacitor device region 9.

FIGS. 6A and 6B also depict forming conductive layer 18a, 18b (also referred to as a conductive material) on the first dielectric layer 17a that is present on the channel portion of the SOI layer 4 in the semiconductor device region 8 and the second dielectric layer 17b that is present on the second semiconductor material 10b in the capacitor device region 9. In one embodiment, the first portion of the conductive layer 18a (hereafter referred to as "first conductive layer 18a") provides the gate conductor of the functional gate structure to the semiconductor device 100, and the second portion of the conductor layer 18b (hereafter referred to as "second conductive layer 18b") provides the second electrode (also referred to as upper electrode) of the capacitor 200. Therefore, the first conductive layer 18a may also be referred to as the "gate conductor portion" and the second conductive layer 18b may also be referred to as the "capacitor electrode portion". The first and second conductive layers 18a, 18b are typically formed simultaneously from the same deposition step. Therefore, the first and second conductive layers 18a, 18b typically have the same composition.

The first and second conductive layers 18a, 18b may be composed of any conductive material. The term "conductive" as used to describe the conductive material of the first and second conductive layers 18a, 18b is meant to denote that the material being described has a room temperature conductivity of greater than $10^5 (\Omega\text{-m})^{-1}$. In some embodiments, the first and second conductive layers 18a, 18b are composed of a doped semiconductor material. For example, the semiconductor material of the first and second conductive layers 18a, 18b may be a silicon-containing material that is doped with a p-type or n-type dopant. The silicon-containing material of the first and second conductive layers 18a, 18b may be selected from the group consisting of silicon (Si), single crystal silicon, multi-crystalline silicon, polycrystalline silicon, silicon germanium (SiGe), single crystal silicon germanium, multi-crystalline silicon germanium, polycrystalline silicon germanium and silicon doped with carbon. The n-type or p-type dopant that is present in the first and second conductive layers 18a, 18b may be present in a concentration ranging from $1 \times 10^{18}$ atoms/$cm^3$ to $2 \times 10^{21}$ atoms/$cm^3$. The n-type or p-type dopant that is present in the first and second conductive layers 18a, 18b may be present in a concentration ranging from $5 \times 10^{19}$ atoms/$cm^3$ to $5 \times 10^{20}$ atoms/$cm^3$.

In some embodiments, the first and second conductive layers 18a, 18b are composed of an elemental metal or a metal nitride. For example, the first and second conductive layers 18a, 18b may be composed of a metal selected from the group consisting of tungsten (W), titanium (Ti), tantalum (Ta), platinum (Pt), palladium (Pd), Hafnium (Hf), Zirconium (Zr), aluminum (Al) and combinations thereof. The first and second conductive layers 18a, 18b may also be composed of a metal nitride selected from the group consisting of titanium nitride (TiN), tantalum nitride (TaN), tantalum silicon nitride (TaSiN), or a combination thereof.

The first and second conductive layers 18a, 18b may be deposited using chemical vapor deposition (CVD) or physical vapor deposition. Variations of CVD processes suitable for forming the semiconductor material of the first and second conductive layers 18a, 18b include, but are not limited to, Atmospheric Pressure CVD (APCVD), Low Pressure CVD (LPCVD), Plasma Enhanced CVD (EPCVD), Metal-Organic CVD (MOCVD), atomic layer deposition (ALD), and combinations thereof. When the first and second conductive layers 18a, 18b are composed of a semiconductor material, the semiconductor material may be doped with the n-type and/or p-type doping using in-situ doping methods or ion implantation. Variations of PVD processes suitable for forming a first and second conductive layers 18a, 18b composed of a metal include sputtering and plating. A metal containing first and second conductive layers 18a, 18b may also be formed using atomic layer deposition (ALD) and/or chemical vapor deposition (CVD).

The material layer for the first and second conductive layers 18a, 18b may be blanket on the semiconductor device region 8 and the capacitor device region 9. The first conductive layer 18a may fill the opening to the channel portion of the SOI layer 4 in the semiconductor device region 8. Following deposition, the material layer for the first and second conductive layers 18a, 18b may be planarized so that the upper surface of the intralevel dielectric layer 14 is coplanar with the upper surface of the first and second conductive layers 18a, 18b, as depicted in FIG. 6A. Planarization is a material removal process that employs at least mechanical forces, such as frictional media, to produce a planar surface. The material layer for the first and second conductive layers 18a, 18b may be planarized using chemical mechanical planarization (CMP). In one embodiment, the upper surface of the first conductive layer 18a that provides the gate conductor of the functional gate structure 110 is coplanar with an upper surface of the second conductive layer 18b that provides the second electrode of the capacitor 200.

FIGS. 6A and 6B depict one embodiment of device that may be formed in accordance with the present disclosure. The device includes a semiconductor device 100, e.g., FET, present in the semiconductor device region 8 of the ETSOI substrate 5, and a capacitor 200 in the capacitor device region 9 of the ETSOI substrate 5. The semiconductor device 100 includes a functional gate structure 110 present on a semiconductor on insulator (SOI) layer 4 of the ETSOI substrate 5, and extension source and drain regions 12, 13 present in the SOI layer 4 on opposing sides of the functional gate structure 110. The functional gate structure 110 includes a gate dielectric provided by the first dielectric layer 17a, and a gate conductor that is provided by the first conductive layer 18a. The semiconductor device 100 further includes raised source and drain regions of epitaxial semiconductor material (hereafter referred to as first epitaxial semiconductor material 10a) on the SOI layer 4 and on opposing sides of the functional gate structure 110.

The capacitor 200 that is present in the capacitor device region 9 may include a first electrode (lower electrode), a node dielectric layer, and a second electrode (upper electrode). At least a portion of the first electrode is provided by an epitaxial semiconductor material (hereafter referred to as a second epitaxial semiconductor material 10b) that has a same composition and crystal structure as the first epitaxial semiconductor material 10a that provides the raised source and drain regions of the semiconductor device 100. The first and second epitaxial semiconductor materials 10a, 10b have the same composition, because they are formed from the same deposition step that is described above with reference to FIGS. 3A and 3B. The first and second epitaxial semiconductor materials 10a, 10b have the same crystalline structure, because they are both epitaxially formed on the SOI layer 4, as described above with reference to FIGS. 3A and 3B. For example, if the SOI layer 4 is composed of a material having a single crystal crystalline structure, the first and second epitaxial semiconductor materials 10a, 10b will also have a single crystal crystalline structure. In some embodiments, the lower electrode of the capacitor is provided by a combination of the SOI layer 4 and the second epitaxial semiconductor material 10b that are present in the capacitor device region 9. The node dielectric of the capacitor 200 is provided by the second dielectric layer 17b, which has the same composition as the gate dielectric that is provided by the first dielectric layer 17a. In one embodiment, the first and second dielectric layers 17a, 17b have the same composition, because they are formed from the same deposition step that is described above with reference to FIGS. 6A and 6B. The second electrode of the capacitor 200 is provided by the second conductive layer 18b, which has the same composition as the gate conductor that is provided by the first conductor layer 18a. In one embodiment, the first and second conductor layers 18a, 18b have the same composition, because they are formed from the same deposition step that is described above with reference to FIGS. 6A and 6B. Although FIGS. 6A and 6B depict a single semiconductor device 100 and a single capacitor 200, it is noted that any number of semiconductor devices 100 may be formed in the semiconductor device region 8, and any number of capacitors 200 may be formed in the capacitor device region 9.

Figure 7:
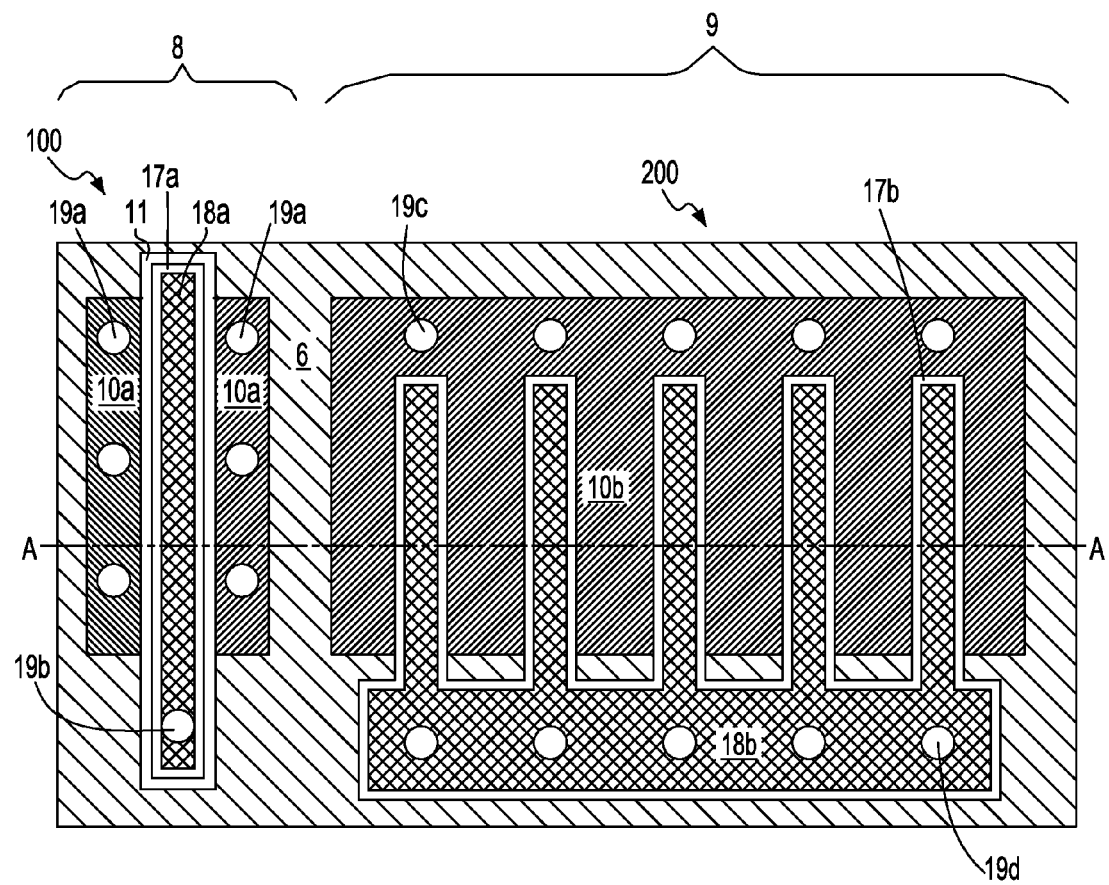
FIG. 7 is a top down planar view depicting forming interconnects to the semiconductor devices and the capacitors that are depicted in FIG. 6B, in accordance with one embodiment of the present disclosure.

FIG. 7 depicts forming interconnects 19a, 19b, 19c, 19d to the semiconductor device 100 and the capacitor 200 that are depicted in FIG. 6B. The interconnects 19a, 19b, 19c, 19d may be formed through an interlevel dielectric layer (not shown) that is blanket deposited over the ETSOI substrate 5. The interlevel dielectric layer may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer may then patterned and etched to form via holes to the functional gate structure 110, the raised source and drain regions provided by the first epitaxial semiconductor material 10a, the first electrode provided by the second epitaxial semiconductor material 10b, and the second electrode provided by the second conductive layer 18b.

Following via formation, interconnects 19a, 19b, 19c, 19d are formed by depositing a conductive metal into the via holes using deposition methods, such as CVD, sputtering or plating. The conductive metal may include, but is not limited to: tungsten, copper, aluminum, silver, gold and alloys thereof. A first interconnect 19a is in direct contact with the functional gate structure 110, and a second interconnect 19b is in direct contact with the first epitaxial semiconductor material 10a that provides the raised source and drain regions of the semiconductor device 100. A third interconnect 19c is in direct contact with the second epitaxial semiconductor material 10b that provides the first electrode (lower electrode) of the capacitor 200, and a fourth interconnect 19d is in direct contact with the second conductive layer 18b that provides the second electrode (upper electrode) of the capacitor 200.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A device comprising:
a semiconductor on insulator (SOI) substrate including a semiconductor device region and a capacitor device region;
a semiconductor device present in the semiconductor device region, said semiconductor device including a gate structure comprising a gate conductor and present on a semiconductor on insulator (SOI) layer of the SOI substrate, and raised source and drain regions composed of a first portion of an epitaxial semiconductor material on the SOI layer and on opposing sides of the gate structure; and
a capacitor present in the capacitor device region, said capacitor including a first electrode comprised of a second portion of the epitaxial semiconductor material that has a same composition and crystal structure as the first portion of the epitaxial semiconductor material, a node dielectric layer and a second electrode, wherein an upper surface of the gate conductor is coplanar with an upper surface of the second electrode.

2. The device of claim 1, wherein said semiconductor device further comprises extension source and drain regions on opposing sides of the gate structure.

3. The device of claim 1, wherein the node dielectric layer of the capacitor is present on the second portion of the epitaxial semiconductor material.

4. The device of claim 1, wherein the second electrode of the capacitor is comprised of a conductive material.

5. The device of claim 1, wherein the SOI layer has a thickness of less than 10 nm.

6. The device of claim 1, wherein the gate structure further includes a gate dielectric layer that has the same composition as the node dielectric layer of the capacitor.

7. The device of claim 4, wherein the gate conductor of the gate structure has the same composition as the conductive material of the second electrode.

8. The device of claim 1, wherein the second portion of the epitaxial semiconductor material that provides the first electrode of the capacitor comprises a plurality of epitaxial semiconductor material islands.

9. The device of claim 8, wherein each island of the epitaxial semiconductor material islands is separated from an adjacent island of the epitaxial semiconductor material islands by a pitch ranging from 20 nm to 2000 nm.

10. The device of claim 8, wherein an upper surface of the second portion of the epitaxial semiconductor material is coplanar with an upper surface of the first portion of the epitaxial semiconductor material.

11. The device of claim 8, wherein the node dielectric layer is present on an upper surface of the second portion of the epitaxial semiconductor material and a sidewall surface of the second portion of the epitaxial semiconductor material, and the node dielectric layer is present on an upper surface of the SOI layer that is exposed between adjacent islands of the epitaxial semiconductor material, wherein the node dielectric layer is a conformal layer.

12. The device of claim 1, wherein the conductive material that provides the second electrode is a doped semiconductor or the conductive material is an elemental metal.

13. A device comprising:
a semiconductor on insulator (SOI) substrate including a semiconductor device region and a capacitor device region;
a semiconductor device present in the semiconductor device region, said semiconductor device including a gate structure present on a semiconductor on insulator (SOI) layer of the SOI substrate, and raised source and drain regions composed of a first portion of an epitaxial semiconductor material on the SOI layer and on opposing sides of the gate structure; and
a capacitor present in the capacitor device region, said capacitor including a first electrode comprised of a second portion of the epitaxial semiconductor material that has a same composition and crystal structure as the first portion of the epitaxial semiconductor material, wherein the second portion of the epitaxial semiconductor material that provides the first electrode of the capacitor comprises a plurality of epitaxial semiconductor material islands and an upper surface of the second portion of the epitaxial semiconductor material is coplanar with an upper surface of the first portion of the epitaxial semiconductor material.

14. A device comprising:
a semiconductor on insulator (SOI) substrate including a semiconductor device region and a capacitor device region;
a semiconductor device present in the semiconductor device region, said semiconductor device including a gate structure present on a semiconductor on insulator (SOI) layer of the SOI substrate, and raised source and drain regions composed of a first portion of an epitaxial semiconductor material on the SOI layer and on opposing sides of the gate structure; and
a capacitor present in the capacitor device region, said capacitor including a first electrode comprised of a second portion of the epitaxial semiconductor material that has a same composition and crystal structure as the first portion of the epitaxial semiconductor material, a node dielectric layer and a second capacitor, wherein the second portion of the epitaxial semiconductor material that provides the first electrode of the capacitor comprises a plurality of epitaxial semiconductor material islands, and the node dielectric layer is present on an uppermost surface of the second portion of the epitaxial semiconductor material and a sidewall surface of the second portion of the epitaxial semiconductor material, and the node dielectric layer is present on an upper surface of the SOI layer that is exposed between adjacent islands of the epitaxial semiconductor material, wherein the node dielectric layer is a conformal layer.

* * * * *